United States Patent
Naughton

(10) Patent No.: US 7,462,270 B2
(45) Date of Patent: Dec. 9, 2008

(54) CANTILEVER PROBES FOR NANOSCALE MAGNETIC AND ATOMIC FORCE MICROSCOPY

(75) Inventor: Michael J. Naughton, Norwood, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 0 days.

(21) Appl. No.: 11/800,598

(22) Filed: May 7, 2007

(65) Prior Publication Data

US 2007/0235340 A1    Oct. 11, 2007

Related U.S. Application Data

(60) Division of application No. 11/119,859, filed on May 2, 2005, now Pat. No. 7,214,303, which is a continuation-in-part of application No. 10/665,800, filed on Sep. 18, 2003, now Pat. No. 6,887,365.

(60) Provisional application No. 60/412,319, filed on Sep. 20, 2002.

(51) Int. Cl.
*C25D 5/18* (2006.01)

(52) U.S. Cl. ............... 205/104; 205/118; 73/105

(58) Field of Classification Search ............ 205/104, 205/118, 122, 766; 73/105; 324/300
See application file for complete search history.

(56) References Cited

U.S. PATENT DOCUMENTS

| | | | | |
|---|---|---|---|---|
| 6,020,747 A * | 2/2000 | Bahns et al. | | 324/754 |
| 6,401,526 B1 | 6/2002 | Dai et al. | | 73/105 |
| 6,528,785 B1 | 3/2003 | Nakayama et al. | | 250/306 |
| 6,656,712 B1 | 12/2003 | Balavoine et al. | | 435/176 |
| 6,706,402 B2 | 3/2004 | Ruecker et al. | | 428/408 |
| 6,737,939 B2 | 5/2004 | Hoppe et al. | | 333/186 |
| 6,741,019 B1 * | 5/2004 | Filas et al. | | 313/355 |
| 6,755,956 B2 | 6/2004 | Lee et al. | | 205/104 |
| 6,887,365 B2 | 5/2005 | Naughton | | 205/104 |
| 2005/0034529 A1 | 2/2005 | Tang et al. | | 73/777 |
| 2005/0176228 A1 | 8/2005 | Fonash et al. | | 438/597 |
| 2007/0125946 A1 * | 6/2007 | Boye et al. | | 250/309 |

OTHER PUBLICATIONS

PCT International Search Report based on PCT/US06/09523 dated Oct. 26, 2007.
J. Li et al., *Highly-Ordered Carbon Nanotube Arrays for Electronics Applications*, Applied Physics Letters, vol. 75, No. 3, pp. 367-369, Jul. 19, 1999.

(Continued)

*Primary Examiner*—Louis M Arana
(74) *Attorney, Agent, or Firm*—Greenberg Traurig, LLP; David J. Dykeman; Danielle T. Abramson

(57) ABSTRACT

The various embodiments discloses a cantilever probe comprising a first electrode and a second electrode engaged to a substrate and a branched cantilever wherein the cantilever comprises a nanostruture. Furthermore, the probe comprises a first arm of the cantilever engaged to the first electrode and a second arm of the cantilever engaged to the second electrode. Additionally, the cantilever probe comprises an electrical circuit coupled to the cantilever wherein the electrical circuit is capable of measuring a change in piezoresistance of the cantilever resulting from an atomic force and/or a magnetic force applied to the cantilever. Additionally, the invention discloses a method of performing atomic force microscopy, magnetic force microscopy, or magnetic resonance force microscopy. The nanostructures may comprise carbon or non-carbon materials. Additionally, the nanostructures may include nanotubes, nanowire, nanofibers and various other types of nanostructures.

20 Claims, 8 Drawing Sheets

OTHER PUBLICATIONS

W.Z. Li et al., *Large-Scale Synthesis of Aligned Carbon Nanotubes*, Science, vol. 274, pp. 1701-1703, Dec. 6, 1996.

W.Z. Li et al., *Straight Carbon Nanotube Y Junctions*, Applied Physics Letters, vol. 79, No. 12, pp. 1879-1881, Sep. 17, 2001.

* cited by examiner

US 7,462,270 B2

CANTILEVER PROBES FOR NANOSCALE MAGNETIC AND ATOMIC FORCE MICROSCOPY

RELATED APPLICATION

This application is a divisional of U.S. application Ser. No. 11/119,859, filed May 2, 2005, which is a continuation-in-part of U.S. application Ser. No. 10/665,800, filed on Sep. 18, 2003, now U.S. Pat. No. 6,887,365, which claims the benefit of U.S. Provisional Application No. 60/412,319, filed on Sep. 20, 2002, and the entire teachings of the above applications are incorporated herein by reference.

GOVERNMENT SUPPORT

The present invention was made with partial support from The National Science Foundation Grant Number 0210533. The United States Government retains certain rights to the invention.

FIELD OF THE INVENTION

The various embodiments disclosed herein relate to microdimensional analytical probes for Magnetic Force Microscopy, Magnetic Resonance Force Microscopy and other forms of scanned probe microscopy, including Atomic Force Microscopy. In particular, the embodiments relate to nanoscale materials having piezoelectric properties such as nanotubes or nanowires with pre-determined morphology that function as analytical probes in a Magnetic Force Microscopy, Magnetic Resonance Force Microscopy, or Atomic Force Microscopy device or in various other scanned probe microscopy applications.

BACKGROUND OF THE INVENTION

Magnetic Force Microscopy (hereinafter referred to as MFM) and Magnetic Resonance Force Microscopy (hereinafter referred to as MRFM) provide micrometer-scale imaging of magnetic structures and surfaces. In MFM, a ferromagnet-tipped cantilever is brought into close proximity with a sample surface to detect the force between the tip and the sample. The tip is scanned over the surface to reveal the magnetic domain structure of the sample. A typical application of MFM is in data storage technology, such as magnetic disk drives. MRFM is potentially significantly more sensitive than MFM, with capability of providing nanometer-scale three-dimensional (3D) imaging of small structures such as semiconductor quantum dots (e.g., for quantum computing) and biological samples such as cells, proteins and DNA.

MRFM is a combination of Nuclear Magnetic Resonance Imaging (MRI) and Atomic Force Microscopy (AFM). A Magnetic Resonance Force Microscope (MRFM) is a microscopic imaging instrument that mechanically detects magnetic resonance signals by measuring the force between a permanent magnet and spin magnetization. Conventional MRI is able to provide images of muscular tissue, for example, by measuring changes to a voltage induced in a coil inductor when the magnetic spins of the atoms in the tissue are excited by a radio frequency (RF) magnetic field. The RF field is driven at the natural or "resonance" frequency of the spins, causing them to rotate or precess about a strong static magnetic field. The spins in the case of human MRI studies are those of the hydrogen nuclei (protons) in the fat and water in the body (the human body is about ⅔ hydrogen). The imaging occurs when a gradient, or spatially varying static field is used, such that only a small slice of the specimen is in resonance with the RF field at any given time. The position of this slice is often controllably varied, yielding a position-sensitive measurement of the resonant spin domain (an MRI image). Thus, MRI is based on the absorption and emission of energy in the radio frequency range of the electromagnetic spectrum. The spatial resolution of MRI is about 0.1 millimeter (mm) or perhaps slightly less (10 µm resolution has been achieved in a lab based non-commercial NMR microscope).

AFM is fashioned after the scanning tunneling microscope (STM). AFM has the capability of imaging individual atoms on the surface of a material by measuring the atomic-scale repulsive force between the atoms themselves and the tip of a compliant cantilever, usually made of silicon or silicon-nitride. When brought extremely close to the surface under study (on order of about 1 nanometer), the interaction forces between the surface and tip cause the cantilever to deflect or bend. This deflection is then measured, usually by reflecting a laser beam off the back of the cantilever and toward a photodiode detector. The AFM can accurately image structures down to the Angstrom scale ($10^{-10}$ m), about a million times smaller than that of MRI.

Both an MFM and an MRFM device typically comprise a small ferromagnet that is attached to the terminal end of an AFM cantilever. This ferromagnet generates an inhomogeneous magnetic field (a gradient field), whereby the magnetic field of the ferromagnet decreases sharply with increasing distance from the cantilever. When a magnetic moment M is exposed to a gradient magnetic field ($\delta B/\delta r$), it experiences a force F equal to the product of the moment and the gradient (F=M $\delta B/\delta r$). If the AFM cantilever with the associated magnetic tip is positioned near the surface of a specimen material containing a plurality of magnetic moments (spins), the possibility exists for those spins to feel the magnetic gradient $\delta B/\delta r$ and thereby the force F. This in turn causes the cantilever to feel an equal and oppositely directed force, causing it to deflect. Thus, the cantilever senses the presence of magnetic spins at and, in the case of MRFM, even beneath the specimen surface.

The relative positions of the cantilever and the specimen may be changed, or scanned, in an MFM or MRFM device, to yield a spatial map of the force F experienced by the cantilever, which translates as a spatial map of the underlying magnetic spin structure of the specimen. In addition to lateral and vertical scanning typical of an AFM device, which provides a topographic map of the surface of a specimen, an MRFM device provides additional vertical scan information, resulting in three-dimensional imaging of the specimen with sub-surface capability similar to MRI, but with AFM-scale resolution.

The ultimate spatial and magnetic moment resolutions of both the MFM device and the MRFM device are determined by the magnitude of the magnetic field gradient $\delta B/\delta r$, the mechanical limitations of the cantilever, and the sensitivity of the cantilever motion detector. Smaller physical dimensions of the cantilever are highly desirable to enable imaging of smaller particles such as cells and proteins and DNA. However, the present state of the art detection scheme employs laser light directed at and reflected off the backside of the cantilever, toward a photodetector or interferometer. As the cantilever size decreases, optical detection becomes increasingly difficult, especially when the cantilever dimensions approach or become less than the wavelength of the light in the detector beam. The use of micro-scale cantilevers is a major factor in limiting MFM and especially MRFM resolution in present devices, which is presently at the 10,000 to 100,000 spin level. Micro-dimensional probes that are capable of detecting single proton and single electron spin are therefore, not possible using present cantilevers.

As such, there remains a need in the art for nanoscale cantilevers which may be incorporated into such applications as MFM, MRFM, AFM and other forms of scanned probe microscopy.

SUMMARY OF THE INVENTION

In an embodiment, the disclosure provides an MFM or MRFM analytical device comprising a micro-dimensional probe that is capable of detecting single proton and single electron spin. In an embodiment, the disclosure comprises an MFM or MRFM device comprising a micro-dimensional probe, that is capable of detecting magnetic structures of objects of size on the order of about one nanometer. An embodiment provides micro-dimensional cantilever piezoelectric probes for an MFM or MRFM device. An embodiment provides a micro-dimensional probe for an MFM or MRFM device that comprises a cantilever composed of a carbon nanotube (herein after referred to as CNT cantilever) that comprises a nanoscale ferromagnetic material or "nanomagnet". In an embodiment, a cantilever comprises a nanostruture wherein the nanostructure comprises non-carbon materials. In an embodiment, the nanostructure is a nanowire. In an embodiment, the CNT cantilever may be attached to an electrode as a component of a microscopic probe which, in turn, is coupled with an electrical circuit as a component of a device for nanoscale MFM or MRFM micro-dimensional probes. The device, comprising the probe and electrical circuit, can be incorporated into an existing scanning probe microscope (hereinafter referred to as SPM) apparatus having accommodation for electrical readout.

In an embodiment, the cantilever comprises a carbon nanotube. Carbon nanotubes (hereinafter referred to as CNTs) offer significant advantages in that they possess piezoelectric properties. Various materials which possess these piezoelectric properties (either intrinsically or extrinsically, explained below) are within the spirit and scope of the present invention. The piezoelectric properties allow a means of internally detecting the movement of a cantilever comprised of a CNT. The internal detection method eliminates the need for an external detection method such as the reflection of a laser beam off the cantilever toward a photodiode detector. CNTs also possess substantially higher strength-to-weight ratio and superior mechanical properties over other materials such as silicon. CNTs can have linear or non-linear morphologies. Linear CNTs as defined herein, refers to CNTs that do not contain any branches originating from the surface of individual CNT tubules along their linear axes. Branched CNTs as defined herein, refer to non-linear CNTs with at least one location along the linear tubule axis or at the tubule terminal from which one or more tubules originate, including having linear tubule axes that are non-identical to the tubule from which they originate. Such points of origination of additional tubules (branch points) are also referred to herein as "junctions". Branched CNTs can include, for example, "Y-shaped" CNTs and "V-shaped" CNTs. In an embodiment, the cantilever is a Y-shaped CNT. In an embodiment, the cantilever is a V-shaped CNT. Important structural attributes of CNTs that determine their mechanical and electrical properties can be controlled and "tailored" for specific probe requirements.

Unlike conventional optical-detection based systems such as MFM and MRFM-based detection wherein the measuring device is scanned by conventional means (for example, those employed by typical scanning probe microscopes) near a magnetic surface, the cantilever device of the invention involves the passage of an electric current into and out of (i.e. through) the cantilever, with cantilever tip motion detected via a change in the electrical resistance upon deflection due to the piezoresistive effect. Conventional resistance bridge circuitry is employed to measure the resistance and its change due to cantilever motion. This can be operated in DC (direct current) or AC (alternating current) modes, using conventional constant current amplitude or constant voltage amplitude sources. Certain signal-to-noise advantages are obtained while operating in AC mode, in particular if the measurement (current/voltage) frequency matches the mechanical resonance frequency of the cantilever device.

Detection circuitry may include a Wheatstone bridge operated in AC or DC mode, AC phase sensitive detection using a ratio transformer or a lock-in detector, or DC detection using a constant current source and a sensitive voltmeter. Differential measurements may be employed for increased sensitivity, by sending an electrical current through two nominally identical piezoresistive sensors in series combination, with only one of these sensors being in adjacent to the sample surface under investigation.

In an embodiment, a method for fabricating an analytical device and methods for analyzing specimen test samples by nanoscale MFM and by nanoscale MRFM using an analytical device comprising a CNT cantilever probe is provided. Used for MRFM, the CNT probe enables three-dimensional magnetic resonance imaging of samples for detection of biological molecules such as DNA, biological cells, and microscopic imperfections such as single impurities in solids, at the molecular/atomic level.

In an embodiment, an MRFM probe is disclosed that includes a CNT cantilever component. In an embodiment, the probe comprises a branched CNT cantilever, comprising a ferromagnetic material, that is attached to an electrode. In an embodiment, the branched CNT cantilever is attached to the electrode by at least one of the CNT cantilevers tubules. In an embodiment, the branched CNT cantilever is attached to the electrode by the ends of the top two arms of the branched CNT cantilever, and the bottom third of the cantilever is extended out from the substrate. In an embodiment, the branch that is extended out from the substrate is referred to as the cantilevered end. In an embodiment, a ferromagnetic material is attached to the terminus of the cantilevered end of the CNT cantilever. In an embodiment, the ferromagnetic material is attached to the junction of the CNT cantilever. In an embodiment, the cantilever comprises a terminally capped ferromagnetic layer.

In an embodiment, the ferromagnetic material is a ferromagnetic nanoparticle. In an embodiment, the ferromagnetic nanoparticle can act as the MRFM spin probe near a specimen surface.

In an embodiment, an analytical device comprises a probe comprising a carbon nanotube cantilever, having attached thereto a ferromagnetic material, coupled to an electrode.

In an embodiment, a method of detection is disclosed for nanoscale MRFM using a carbon nanotube cantilever. In an embodiment, readout of the cantilever can be achieved electrically, eliminating the need for optical interferometry or other optical detection methods, which become problematic as cantilever dimensions are reduced to sub-optical-wavelength. In an embodiment, the method uses the intrinsic piezoelectric or piezoresistance properties of the carbon nanotubes to provide a readout in the nanoscale MRFM device.

In an embodiment, fabrication and isolation of carbon nanotube cantilevers probes is disclosed. In an embodiment, multi-walled CNTs are preferred. In an embodiment, the substrate is an electron-beam patterned substrate. In an embodiment, the CNT cantilevers can be obtained by growing CNTs on a catalyst-containing substrate surface by a number of known methods, include chemical vapor deposition. In an embodiment, CNTs can be grown in arrays. In an embodiment, the catalyst containing surface for CNT growth can be patterned on a material surface by conventional lithography so as to produce CNT "nanocircuits". In an embodiment, ferromagnetic material can be attached to the terminus of one of the branches of the cantilever using deposition techniques known in the art. In an embodiment a cobalt nanorod is attached to the cantilever using a polymeric adhesive.

In an embodiment, the ferromagnetic material is attached to the nanotube as a result of nanotube formation, that is, a portion of the (ferromagnetic) catalyst material that nucleates CNT groups remains fixed to the end of the CNT.

Additionally, the fabrication of an electrode comprising CNT cantilever probes is disclosed. In an embodiment, the CNTs can be attached to the electrode on a lithographically prepared substrate using SPM manipulation by standard methods known in the art. In an embodiment, the CNTs comprised in the probes can be formed directly on the substrate.

In an embodiment, a method of constructing an analytical device for use in nanoscale MRFM is disclosed. Additionally, an embodiment comprises a method of analyzing a sample with nanoscale MRFM.

In an embodiment, a cantilever probe comprises a first electrode and a second electrode engaged to a substrate and a branched cantilever wherein the cantilever comprises a nanostruture. Furthermore, the probe comprises a first arm of the cantilever engaged to the first electrode and a second arm of the cantilever engaged to the second electrode. Additionally, the cantilever probe comprises an electrical circuit coupled to the cantilever wherein the electrical circuit is capable of measuring a change in piezoresistance of the cantilever resulting from an atomic force applied to the cantilever.

An embodiment includes a method of performing atomic force microscopy (AFM) comprising providing a first electrode and a second electrode engaged to a substrate and providing a branched cantilever wherein the cantilever comprises a nanostruture. Next, the method discloses engaging a first arm of the cantilever to the first electrode and a second arm of the cantilever to the second electrode. Furthermore, the method comprises positioning the cantilever adjacent to a substance to be analyzed and measuring a change in a piezoresistance of the cantilever resulting from an atomic force acting upon the cantilever by the substance to be analyzed.

In an embodiment, a cantilever probe comprises a first electrode and a second electrode engaged to a substrate and a branched cantilever wherein the cantilever comprises a nanostruture. In an embodiment, a probe comprises a first arm of the cantilever engaged to the first electrode and a second arm of the cantilever engaged to the second electrode and a ferromagnetic material engaged the cantilever. Additionally, an electrical circuit coupled to the cantilever wherein the electrical circuit is capable of measuring a change in piezoresistance of the cantilever resulting from a magnetic force applied to the cantilever.

BRIEF DESCRIPTION OF THE DRAWINGS

The present invention will be further explained with reference to the attached drawings, wherein like structures are referred to by like numerals throughout the several views. The drawings shown are not necessarily to scale, with emphasis instead generally being placed upon illustrating the principles of the present invention.

While the above-identified drawings set forth preferred embodiments of the present invention, other embodiments of the present invention are also contemplated, as noted in the discussion. This disclosure presents illustrative embodiments of the present invention by way of representation and not limitation. Numerous other modifications and embodiments can be devised by those skilled in the art which fall within the scope and spirit of the principles of the present invention.

DETAILED DESCRIPTION OF THE INVENTION

Definitions

The term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules can then be deposited on a nearby substrate (the "D" in CVD), with the rest pumped away.

The term "piezoresistance" is defined in the art as a change in resistance in a material, caused by an applied stress. Piezoresistance or piezoelectric properties of CNTs are the variations of the electrical resistance of the CNT due to stress caused by a deflection or bending of at least one end.

The term "ferromagnetic" is afforded the term commonly given in the art. A "ferromagnetic material" is a material having the ability to maintain magnetization in the absence of a magnetic field. Typical ferromagnetic materials comprise elements selected from transition metals of the periodic table and alloys thereof. Preferred ferromagnetic elements are cobalt, iron, nickel, and alloys thereof.

The term "nanomagnet" is defined in the art as a ferromagnetic material having dimensions from about 1 nanometer (nm) to about 10 micrometers.

MRFM Device Comprising a CNT Ferromagnetic Probe

In an embodiment, an MRFM analytical device comprises a micro-dimensional probe that is capable of detecting single proton and single electron spin. More specifically, a micro-dimensional probe for an MRFM device comprises a CNT cantilever that includes a ferromagnetic particle. In an embodiment, the CNT cantilever can be attached to an electrode as a component of a probe. In an embodiment, the probe can be coupled with an electrical circuit as a component of a device for nanoscale MRFM micro-dimensional probes.

Figure 1:
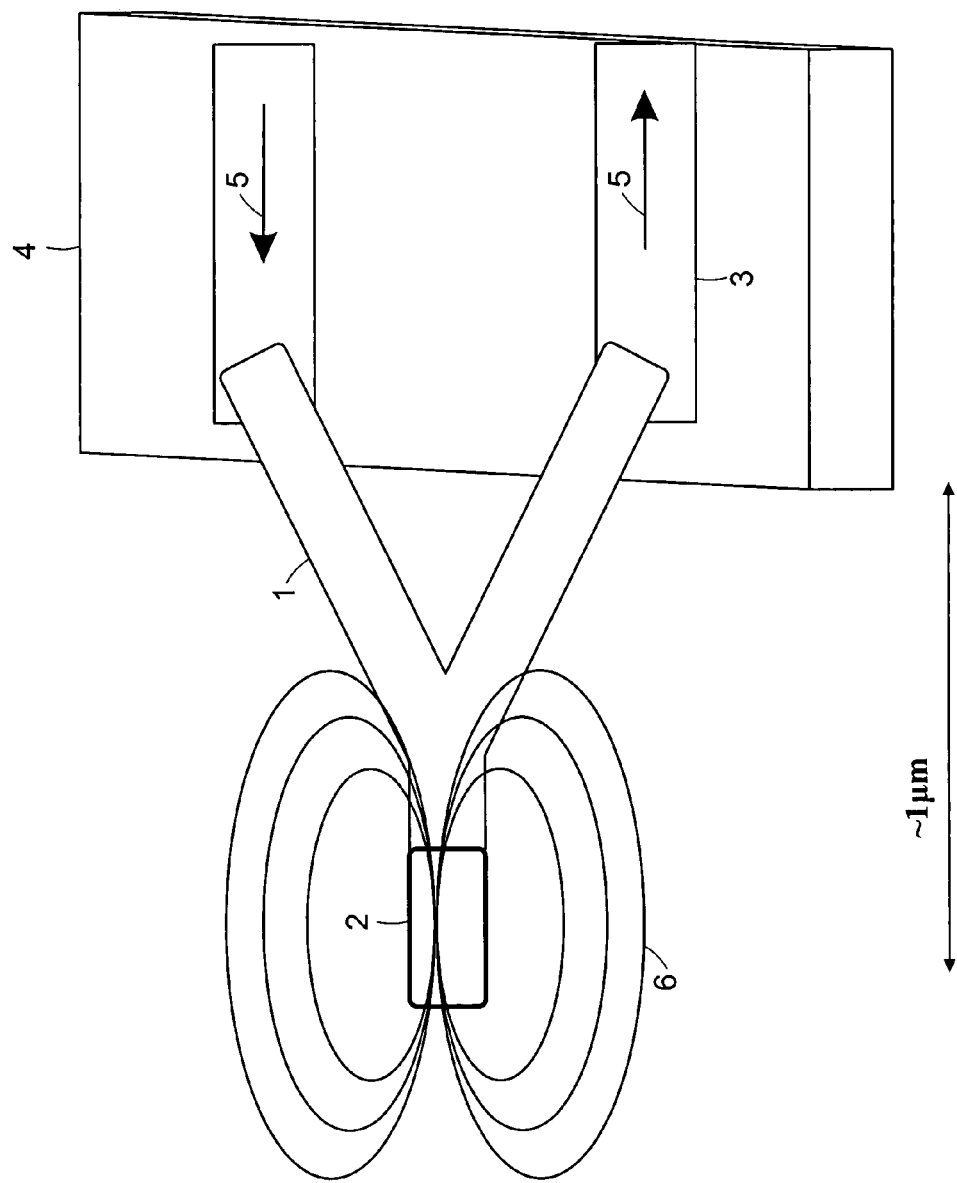
FIG. 1 shows a schematic drawing of an analytical device for use in a nanoscale MRFM containing the CNT cantilever probe of the invention.

FIG. 1 shows an embodiment of a cantilever probe. Two arms of a branched CNT cantilever 1, are connected to electrodes 3, which are engaged to a surface of a substrate 4. A ferromagnetic material 2 is attached to the cantilevered end of the CNT cantilever 1. Arrows 5 show the direction of an alternating electrical current flowing though the device. The gradient field felt by the specimen spins are represented by dashed lines 6.

In an embodiment, the cantilever comprises a nanostructure. In an embodiment, the nanostructure is a CNT. In an embodiment, CNTs are cylinders of networked carbon atoms that can have cylindrical diameters as small as about 0.4 nm (1 nm=$10^{-9}$ m). In an embodiment, CNTs can be prepared in lengths from about 10 nm to about 100,000 nm (0.1 mm) and diameters from about 1 nm to about 100 nm. Those skilled in the art will recognize that CNTs of various lengths and/or diameters are within the spirit and scope of the present invention.

In an embodiment, smaller diameter CNTs (about 0.4 nm to about 10 nm) may be comprised of a single tubule of networked carbon atoms, and are referred to as single-walled carbon nanotubes (hereinafter referred to as SWNTs). In an embodiment, CNTs also may comprise nested concentric cylinders, referred to as multiwalled carbon nanotubes (hereinafter referred to as MWNTs). In an embodiment, the dimensions are a diameter between about 1 nm and about 50 nm, and a length between about a submicron and about 100 micrometers. In an embodiment, the CNT tubules have a length ranging between about 1 micrometer to about 10 micrometers.

In an embodiment, CNTs have conducting properties depending on chirality (the rotation of the symmetry of carbon network along the cylinder axis). In an embodiment, CNTs can be metallic, semiconducting or insulating. In an embodiment, single walled nanotubes can be metallic or semiconducting, depending on chirality. In an embodiment, MWNTs are metallic. Both CNT species are mechanically robust, with a Young's modulus of about 1 TPa ($10^{12}$ Pa). Those skilled in the art will recognize that CNTs with a wide range of Young's modulus values are within the spirit and scope of the present invention.

The sub-micron diameter makes CNTs ideal candidates for the reduced-size, "nanoscale" cantilevers required for MRFM imaging of nanoscale features in samples. Moreover, the small dimensions will lead to increased mechanical resonance frequencies due to the smaller mass (resonance frequency varies inversely with the square root of the mass $f_0 \sim 1/m^{1/2}$), a beneficial quality for imaging. As an additional benefit, CNTs offer significant advantages in that they possess piezoelectric properties. The piezoelectric properties allow for internal detection of the movement of a cantilever comprised of a CNT. As such, internal detection of cantilever movement eliminates the need for an external detection device such as the reflection of a laser beam off the cantilever toward a photodiode detector. In addition, CNTs also possess substantially higher strength-to-weight ratio and superior mechanical properties over other materials such as silicon.

CNTs can be linear or non-linear. "Linear CNTs" as defined herein, refer to CNTs that do not contain any branches originating from the surface of individual CNT tubules along their linear axes. "Branched CNTs" as defined herein, refer to non-linear CNTs with at least one location along the linear tubule axis or at the tubule terminal from which one or more tubules originate, having linear tubule axes that are non-identical to the tubule from which they originate. Such points of origination of additional tubules (branch points) are also referred to herein as "junctions". In an embodiment, the branched CNT is Y-shaped. In an embodiment, the branched CNT is V-shaped. In an embodiment, the branched CNT is T-shaped. In an embodiment, the branched CNT is X-shaped. Those skilled in the art will recognize that various other morphologies and/or configurations are within the spirit and scope of the present invention.

In an embodiment, the individual arms constituting branched tubules are either symmetrical or unsymmetrical with respect to both arm lengths and the angle between adjacent arms. In an embodiment, each individual arm is between about 1 nm and about 100 micrometers in length. Those skilled in the art will recognize that a wide range of lengths of arms and a wide rang of angles between adjacent arms are within the spirit and scope of the present invention.

Figure 3A:
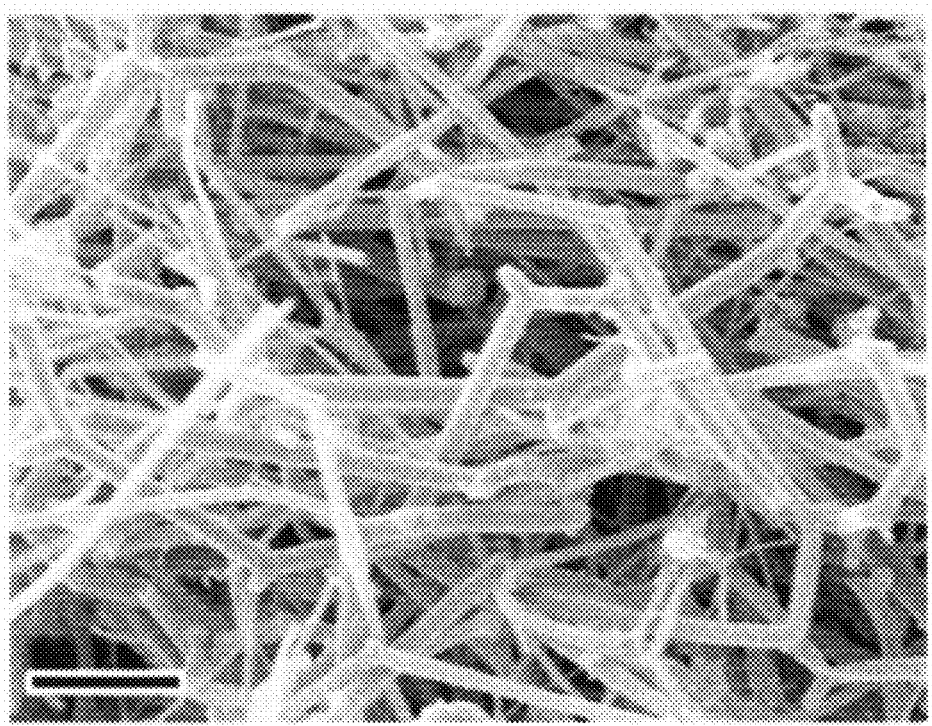
FIG. 3 shows scanning electron microscope (SEM) photomicrographs of symmetrically branched (Y-shaped) CNTs at (a) low magnification (scale bar=1 μm) and (b) high magnification (scale bar=200 nm).

FIG. 3 shows an image of an embodiment of a Y-shaped CNT. In an embodiment, the Y-shaped CNTs exist as (1) a plurality of free standing, branched CNTs attached to the substrate and extending outwardly from the substrate outer surface; and (2) one or more CNTs with a branched morphology wherein the CNT tubule structures have Y-junctions with nominally straight tubular arms and nominally fixed angles between said arms.

Figure 4A:
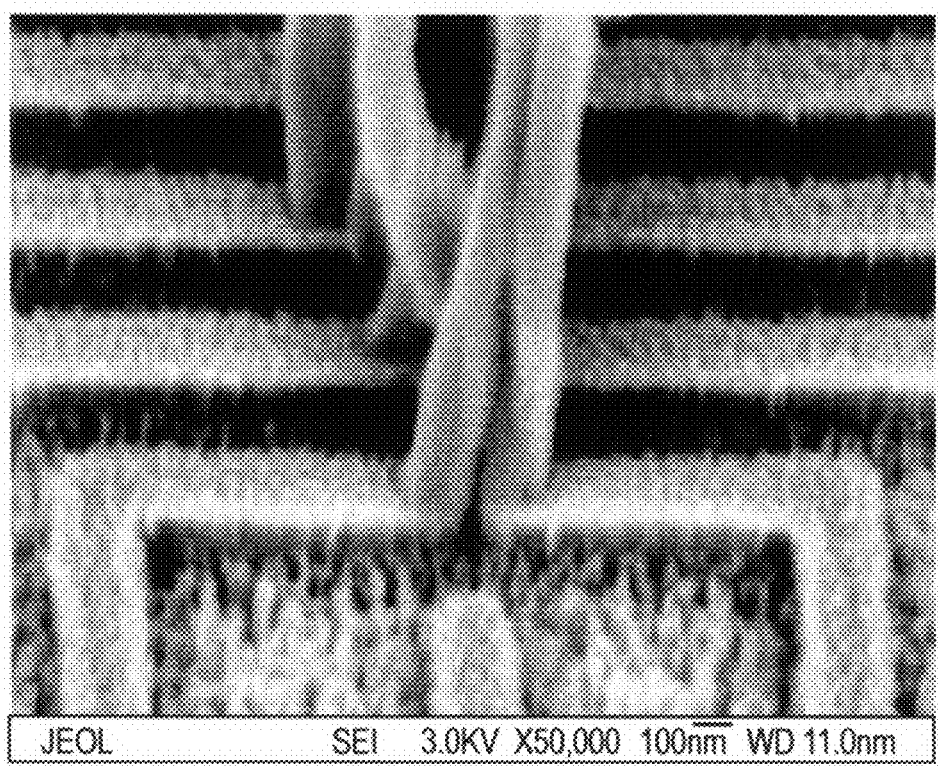
FIG. 4A shows an SEM image of about 100 nm diameter multi-walled CNTs grown by a chemical vapor deposition process on nanolithographically prepared silicon substrates.

In an embodiment, the probe comprises a CNT cantilever which is V-shaped. FIG. 4A shows images of an embodiment of a V-shaped CNT. Important structural attributes of CNTs that determine their mechanical and electrical properties can be controlled and "tailored" for specific requirements.

In an embodiment, a ferromagnetic particle is engaged to an arm of the CNTs. The ferromagnetic particle comprises a ferromagnetic material. In an embodiment, ferromagnetic materials comprise elements selected from transition metals of the periodic table and alloys thereof. In an embodiment, the ferromagnetic particle comprises cobalt, iron, nickel, or alloys thereof. In an embodiment, the ferromagnetic particle comprises a plurality of ferromagnetic particles. In an embodiment, the ferromagnetic particle is in the form of a nanorod. In an embodiment, the nanorod comprises a length of about 10 nm to about 100 nm; in an embodiment, the ratio of the length to diameter of the nanorod is about 2 to about 100. Those skilled in the art will recognize that any ferromagnetic particle may be engaged to the disclosed cantilever and remain within the spirit and scope of the present invention.

Cantilever Probe Fabrication

Figure 2:
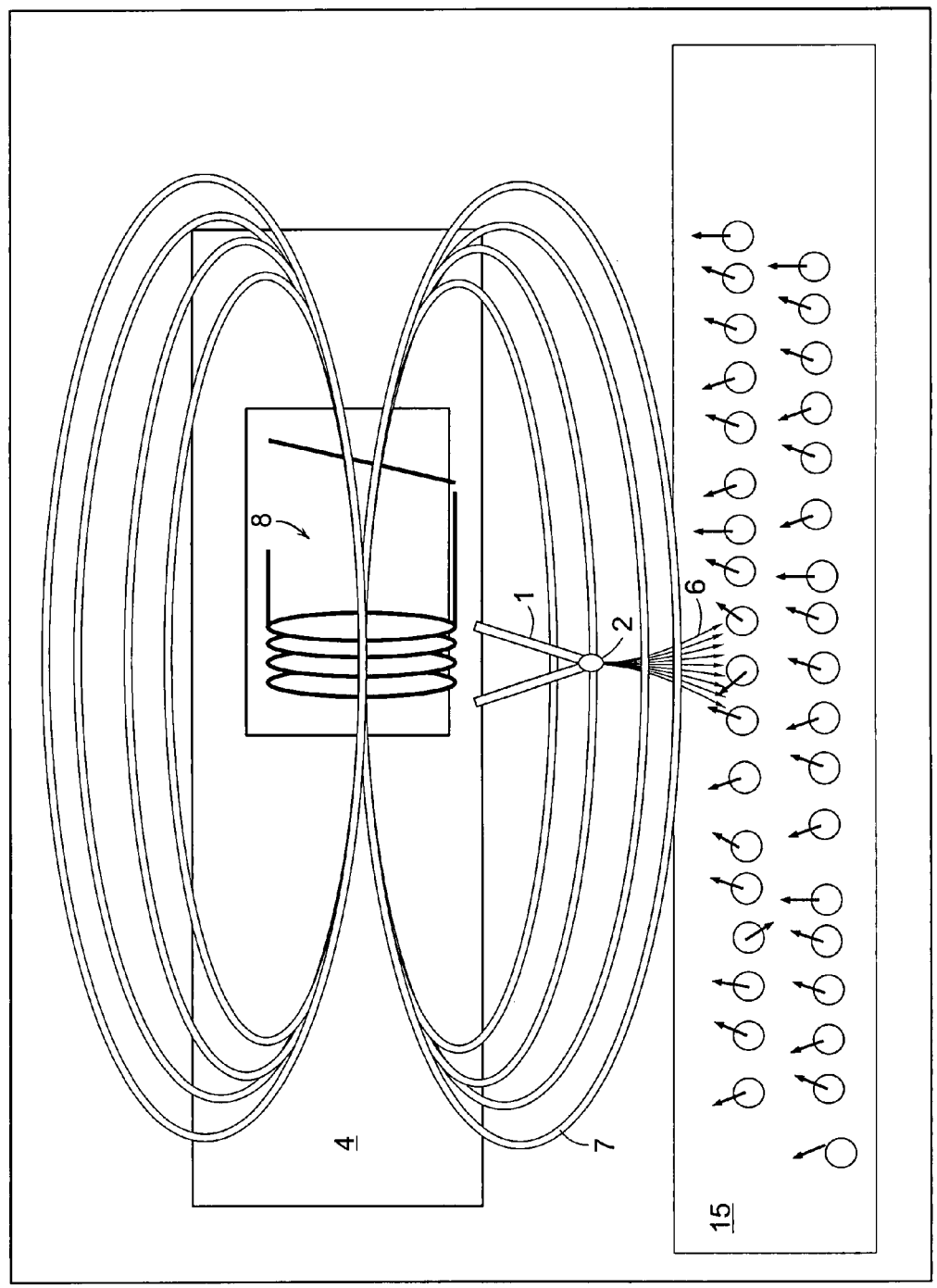
FIG. 2 shows a schematic drawing of an MRFM layout of the analytical device with a CNT cantilever probe.

Methods for fabricating an analytical device comprising a CNT cantilever probe are disclosed. FIG. 1 and FIG. 2 show an embodiment of the assembly of the components comprised in an embodiment of the MRFM analytical device. In an embodiment, the nanotube is positioned as follows: immobilizing two arms of a Y-shaped cantilever 1 to two electrodes 3 on a substrate 4, with the third arm cantilevered out from the substrate edge, as depicted in FIG. 1 and FIG. 2. The flow of a charge from a first arm of a cantilever to a second arm of the cantilever is designated by arrows 5. FIG. 2 depicts the full MRFM layout of the device in which the CNT cantilever 1 is cantilevered out from the substrate 4, and a ferromagnetic material 2 is attached to the free arm of the CNT cantilever 1. The gradient field 6 is felt by sample spins 15. An RF coil is represented as a microcoil 8 integrated into the substrate 4 and produces an RF magnetic field 7.

In an embodiment, branched CNT cantilevers are attached to or grown onto lithographically prepared substrates containing surface metal electrodes. In an embodiment, the substrate comprises on-chip signal processing capabilities.

In an embodiment, the Y-shaped CNTs are used as an MRFM cantilever by attaching the ends of the top two arms of the Y to a substrate, with the bottom, third arm cantilevered out over the edge of the substrate. An embodiment of a Y-shaped CNT is shown in FIG. 3.

In an embodiment, V-shaped CNTs are used as an MRFM cantilever by attaching the arms of the V to a substrate, with the junction cantilevered out over the edge of the substrate. An embodiment of V-shaped CNTs are shown in FIG. 4A.

In an embodiment, Y-shaped and V-shaped CNTs are placed on a substrate using Scanning Probe Microscopy (SPM) manipulation techniques which are known in the art. In an embodiment, the cantilevered arm protrudes perpendicularly from the substrate. In an embodiment, the cantilevered arm lies parallel to the substrate at a substrate edge, such that the device cantilevers out from the edge. Those skilled in the art will recognize that the cantilevered arm may protrude from the substrate at any angle and remain within the spirit and scope of the present invention.

Figure 5:
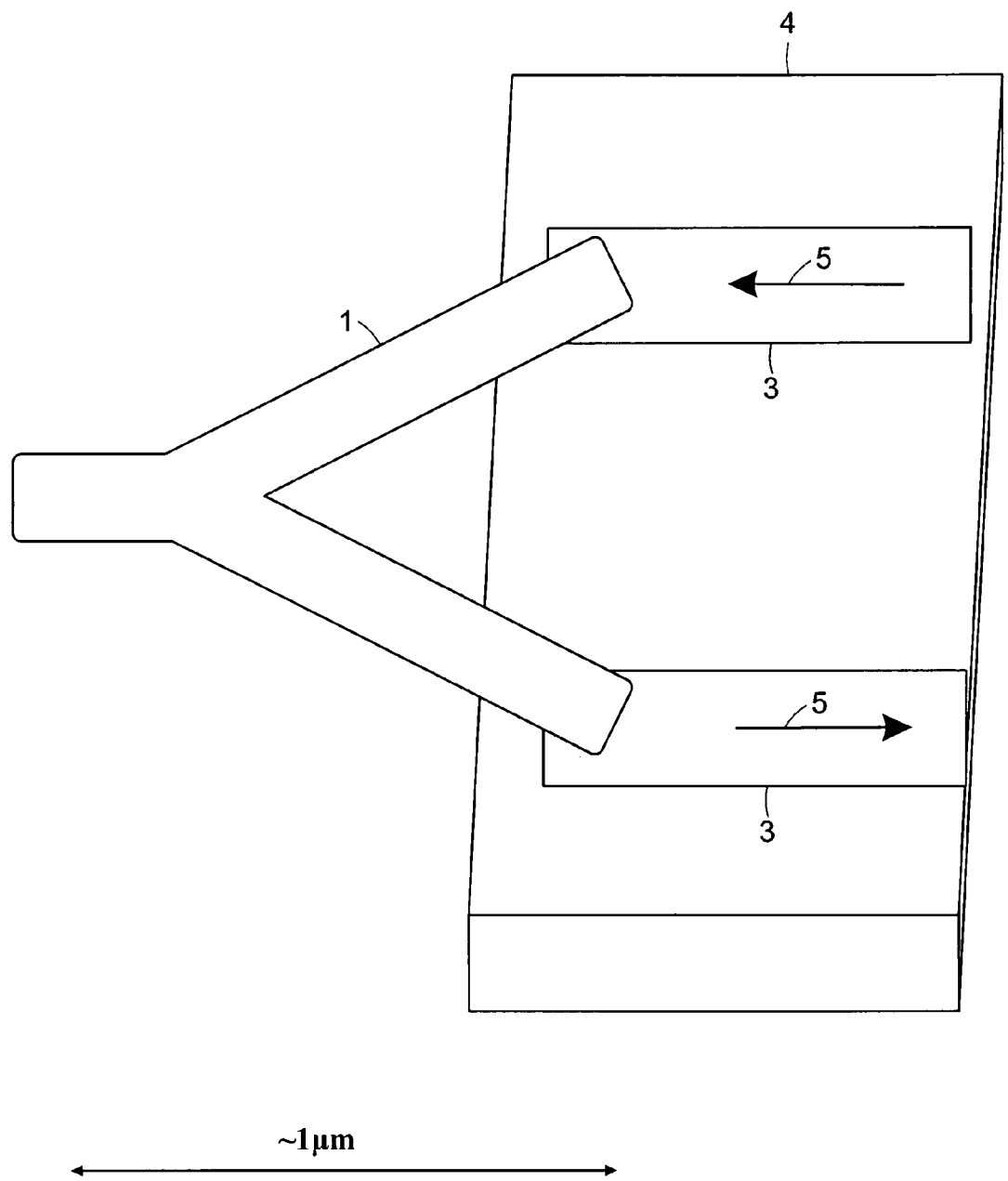
FIG. 5 shows an embodiment of the invention wherein the cantilever is engaged to a set of electrodes by a device-on-electrode methodology.
Figure 6:
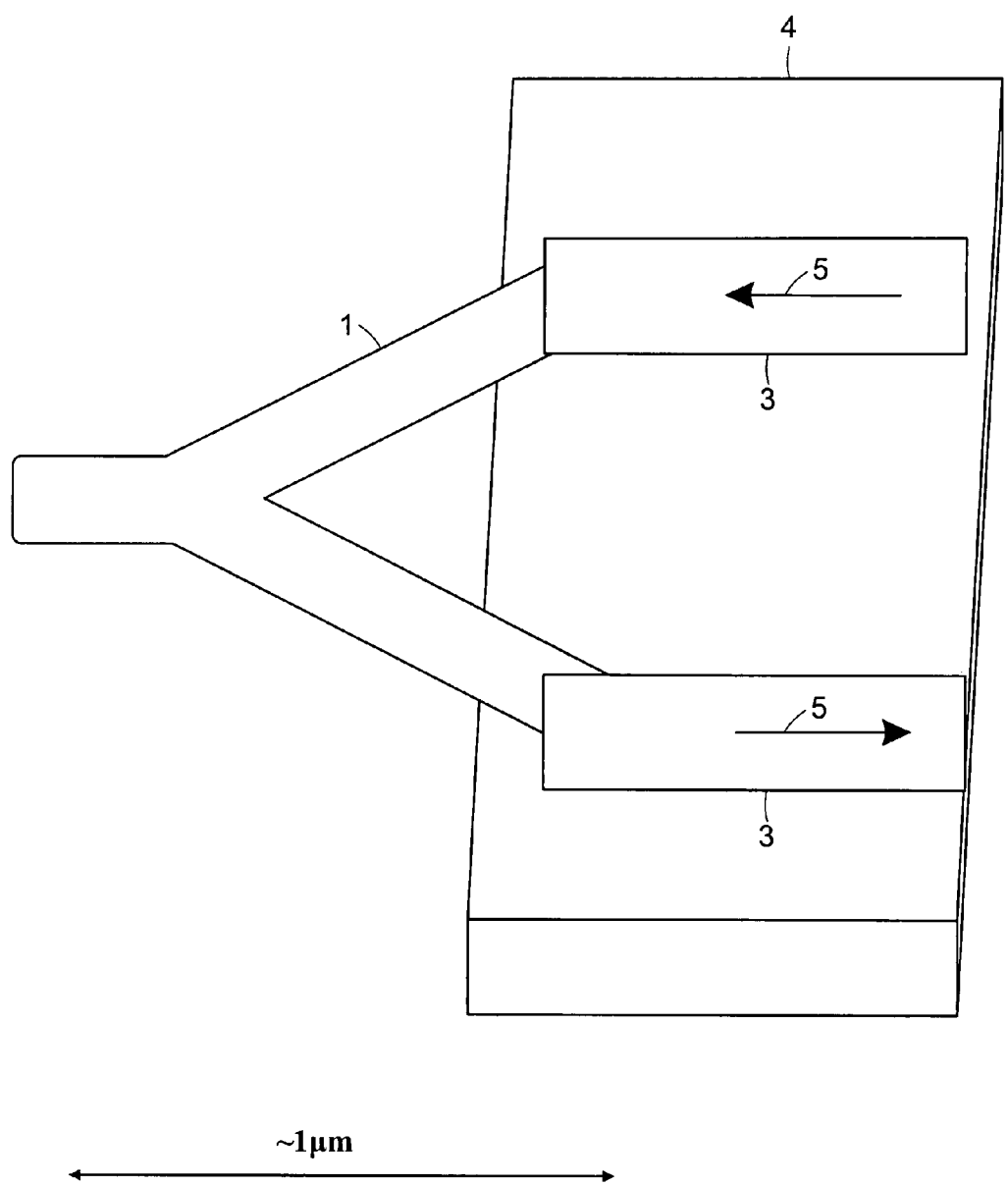
FIG. 6 shows an embodiment of the invention wherein the cantilever is engaged to a set of electrodes by an electrode-on-device methodology.
Figure 7:
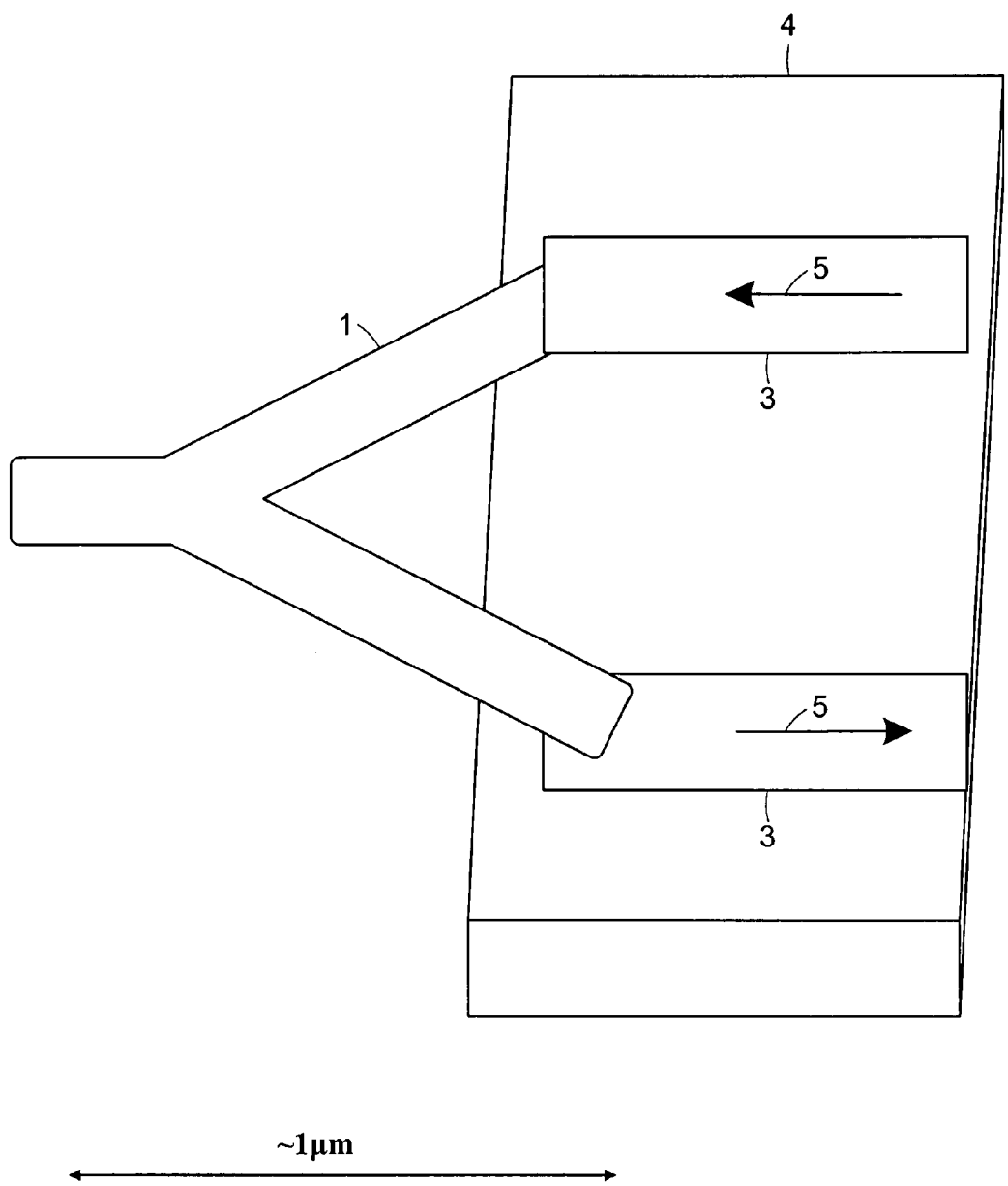
FIG. 7 shows an embodiment of the invention wherein the cantilever is engaged to a set of electrodes by a combination of device-on-electrode and electrode-on-device methodologies.

Connection of the CNT cantilever to a substrate, such as for example silicon, may be accomplished in the following ways: namely, device-on-electrodes, electrodes-on-device or a combination of both methods. FIG. 5 shows an embodiment of the invention wherein the cantilever is engaged to a substrate by a device-on-electrode method. FIG. 6 shows an embodiment wherein the cantilever is engaged to the substrate by an electrode-on-device method. FIG. 7 shows an embodiment of the invention wherein the cantilever is engaged to the substrate by a combination of both methods, i.e., a first arm of the cantilever is engaged to the substrate via a device-on-electrode method and a second arm of the cantilever is engaged to the substrate via an electron-on-device method.

In device-on-electrodes configuration, metallic lead electrodes are deposited by conventional lithographic techniques, possibly including electron-beam lithography, onto a passivated semiconductor substrate (e.g. silicon dioxide or silicon nitride, on silicon). These electrodes are of appropriate thickness, width, length and proximity for later attachment of CNT cantilevers. In an embodiment, electrode dimensions have a thickness of about 100 nm, width of about 100 nm, length of up to about several millimeters (in an embodiment, length of about 1 mm), and proximity (distance between two planar electrodes) of about 100 nm. In an embodiment, the substrate may be prepared with vertical void regions, or edges, with the above electrodes deposited to the edges. CNT cantilevers may then be placed onto the substrate, such as by dispersion of CNTs in solution which is then evaporated, and physically manipulated into place atop the prepared electrodes. One arm of a Y-shaped CNT or the joint of a V-shaped cantilever would be cantilevered out over the substrate edge, or over the void area, forming a cantilever. In an embodiment, additional electrical contact of the fixed ends of the V- or Y-CNT to the surface metallic electrodes could be achieved by electrodeposition, electroless deposition, or electron beam "welding" in a scanning electron microscope (SEM).

Regarding an electrodes-on-device configuration, as shown in FIG. 6, the CNT cantilever is situated on the substrate prior to metal electrode deposition. In a similar fashion to the former device-on-electrodes configuration, the CNT may be manipulated with an SPM into position, forming a cantilever. In an embodiment, the planar coordinates of the final location of the CNT can be identified with an SEM or an SPM. These coordinates are then later used to program a photolithographic or electron beam lithographic system to accurately place metallic electrodes onto a surface and overlapping the ends of the fixed portions of the CNTs, making electrical contact. In an embodiment, preparation of the electrodes-on-device configuration involves a Y or V-shaped CNT situated flat on a substrate. In an embodiment, photolithographic techniques known to the art may be used to both accurately place metallic electrodes overlapping the ends of the Y or V-shaped CNT, and to etch the substrate so as to remove substrate material below a portion of the CNT, facilitating a cantilevered arrangement.

An advantage of using V-shaped CNTs is the ability to grow the CNT cantilevers directly on the substrate, without the added step of attaching a pre-formed CNT cantilever to the substrate. In an embodiment, V-shaped carbon nanotube devices can be formed by growing two nanotubes in precise, close proximity (typically from about 10 nm to about 100 nm) using nanoscale electron-beam lithography, and attaching a ferromagnetic particle to their juncture. Those skilled in the art will recognize that various methods of growing V-shaped CNTs are within the spirit and scope of the present invention.

Figure 4B:
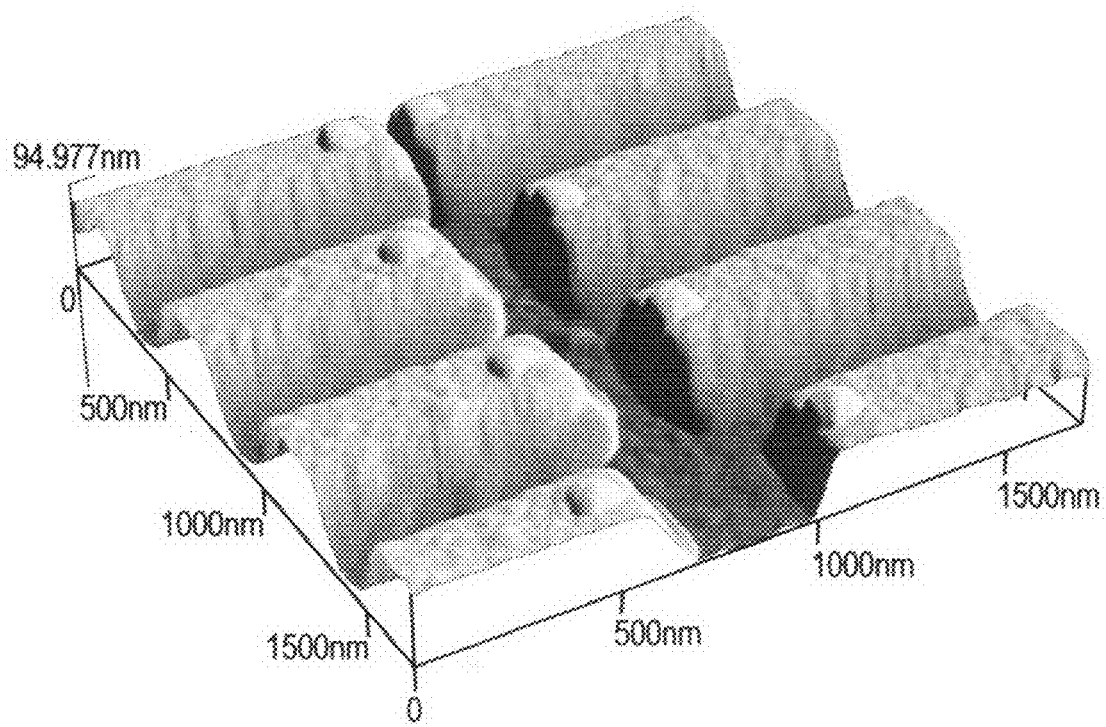
FIG. 4B shows an AFM photomicrograph of tungsten wires on silicon-nitride on a silicon wafer surface.

FIG. 4B shows an AFM image of tungsten wires on silicon-nitride on a silicon wafer surface. The bumps visible at the ends of each wire are nickel nanodots situated to serve as catalyst sites for subsequent growth of CNTs. Referring to FIG. 4A and FIG. 4B, closely spaced nanotubes can be brought into contact electrostatically, and then attaching, by for example electroless deposition, a ferromagnetic nanoparticle to their juncture. The resulting V-shaped device can then be excited electromagnetically (Lorentz force) into mechanical resonance, for MRFM detection.

Nanomagnetic Incorporated CNT Probes

CNTs with pre-determined morphology, such as for example, Y-shaped CNTs, can be synthesized using a variety of methods known in the art. Processes for producing quantities of CNTs having varied morphology, including Y-shaped CNTs, are described in W. Z. Li, et al. *Applied Physics Letters*, Volume 79 (12), 2001, Pages 1879-1881, and J. Li, et al. *Applied Physics Letters*, Volume 75 (3), 1999, Pages 367-369, which are incorporated herein by reference in their entirety.

Figure 3B:
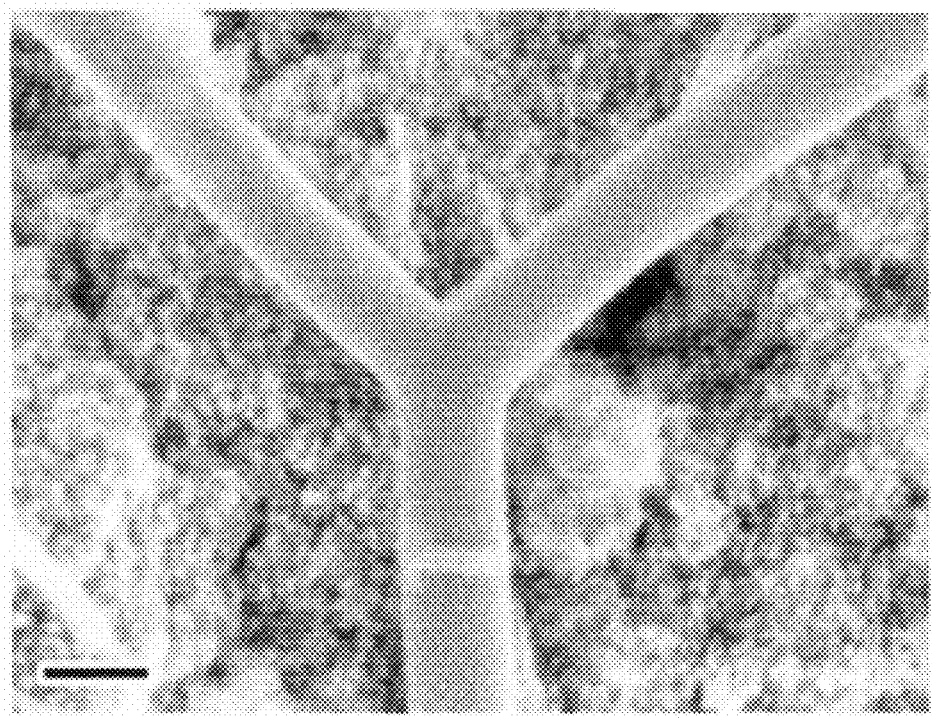

As shown in FIG. 3, branched CNTs typically comprise a plurality of Y-junctions with substantially straight arms extending linearly from said junctions. In an embodiment, CNTs possess Y-junctions having two long arms that are a few microns long (about 2 to about 10 µm), and a third arm that is shorter (about 0.01 to about 2 µm). In an embodiment, the CNTs comprise Y-junctions comprising three long arms (up to about 10 µm). In an embodiment, the method of the invention provides CNTs comprising multiple branches which results in multiple Y-junctions with substantially linear, straight arms. A high magnification SEM micrograph (FIG. 3B) shows that an embodiment of the branched CNTs possess Y-junctions that have a smooth surface and uniform tubule diameter of about 200 nm. In an embodiment, the angles between adjacent arms are close to about 120°, thereby resulting in branched CNTs that have a substantially symmetric structure. In an embodiment, all Y-junctions have a substantially similar structural configuration, regardless of their varying tubule diameters.

In an embodiment, the CNTs comprised in the probes can be synthesized in addressable arrays. Fabrication of addressable CNT arrays utilizes both micro- and nano-lithographic preparation of CNT catalyst sites and metallic addressing wires on single crystal silicon wafers. Subsequently, growth of aligned CNTs on the catalyst surface is accomplished via CVD. In an embodiment, a series of thin gold wires are defined lithographically on the surface of the silicon wafer, wherein the inner ends of pairs of individual wires are in close proximity, for example, about 100 nm apart. In an embodiment, a CNT growth catalyst (for example, nickel (Ni) or cobalt (Co)) nanodot site is defined at these proximal ends using e-beam lithography, following which the catalyst material is deposited. In an embodiment, the wafers are then placed in a chemical vapor deposition (CVD) chamber to initiate CNT growth. In an embodiment, CNT growth occurs at the catalyst nucleation sites.

The fabrication schemes for MRFM probes rely on the use of a nanomagnet such as a ferromagnetic material as the field sensor. In an embodiment, a ferromagnetic material can be attached to the branched CNT cantilever on post-synthesis using typical deposition techniques known in the art (e.g., CVD, and electroless deposition). In an embodiment, the ferromagnetic material is incorporated onto the CNT cantilever as a result of in situ nanotube formation.

In an embodiment, the nanomagnet material in the tubule end of the CNT cantilever probes are generated in-situ during the CNT synthesis. In an embodiment, the catalytic material used in the tubule synthesis comprises a ferromagnetic material that is retained at the tubule ends of the branched CNTs upon synthesis, thereby functioning as "in-situ deposited" nanomagnets in the CNT probe of the invention. In an embodiment, the metal catalysts include the metallic materials, including their mixtures and alloys that have ferromagnetic properties. In an embodiment, transition metals include iron, cobalt and nickel, including mixtures and alloys thereof. In an embodiment, the transition metal is cobalt. For the in-situ incorporation of the nanomagnet material on the CNT probes of the invention, the catalytic material comprising at least one transition metal or transition metal alloy that is deposited on or impregnated within a support substrate comprising a metallic material or a non-metallic material, such as for example, a non-metallic oxide as microparticles. In an embodiment, the catalyst microparticles nucleate the tubule growth in the CNT growth process, whereby they migrate towards the growing ends of the branched CNT tubules and aggregate to form a nanomagnet. The non-metallic oxide comprising the catalytic substrate can be either a transition or a non-transition metallic oxide, or a non-metallic inorganic oxide. Metallic oxides useful in the catalyst materials include, for example, oxides of beryllium, magnesium, calcium, strontium and barium. Preferred metallic oxides include magnesium oxide and calcium oxide. In a currently preferred embodiment, the metallic oxide is magnesium oxide (MgO). In an embodiment, the CNT growth process can be controlled to obtain tubules of approximately uniform dimensions within arrays. Depending on growth conditions (which in turn, are influenced by the catalyst material), individual tubules in an array can vary in height between about 10% to about 50% in any given growth run. Parameters in the growth process of the CNT probe component can be varied to include the separation distance between catalytic sites on the substrate (and therefore, between tubule pairs, and tubule branches), and the dimension (diameter and height) of the catalyst microparticles that nucleates the tubule growth and the catalyst deposition method thereby providing control over the size of the nanomagnet growth in situ. Control of the CNT growth process can be utilized to obtain CNT probes of the invention comprising in-situ generated nanomagnets and multi-walled CNTs with tubule diameters that are controllable down to about 100 nm. In an embodiment, CNT probes with smaller tubule sizes can be obtained by using aligned CNT arrays of single-walled nanotubes.

In an embodiment, the nanotube structure can be driven into mechanical resonance with a Lorentz force, obtained with the use of a static polarizing field oriented in the plane of the "Y" or "V", crossed by an alternating current passing through the two anchored arms of the structure, as in FIG. 2. A ferromagnetic material engaged to the CNT cantilever serves as both the generator of a strong magnetic field gradient to be felt by the spin system to be analyzed (see, for example, FIG. 2), and as the active magnetic sensor which feels the reaction force applied by this spin system. In the usual SPM manner, this MRFM detector can be x-y-z scanned to facilitate 3D imaging of the sample.

In an embodiment, the two fixed arms of the branched CNT cantilever may be attached to metallic electrodes, and an electric current can be sent into one arm and out the other, as in FIG. 1. In an embodiment, as the cantilevered end of the branched assembly moves under the influence of magnetic forces, a strain-induced change in the electrical resistance of the assembly is measured.

In an embodiment, the shape of the branched CNT structures facilitates direct electrical resistance measurements, with nanotube cantilever deflection causing resistance changes via the piezoresistance effect, measured through the attached arms of the branched CNT cantilever.

The conducting, and piezoconducting, properties of these multi-walled CNTs are sensitive to defects, over which there is some degree of control in the growing stage. In an embodiment, the defect sensitivity can be beneficial. In addition to piezoresistance, the branched CNT can exhibit nonlinear rectifying characteristics, such as for example, in a diode, such that the strain dependent conductivity of the nanotube can be incorporated into a nanoscale amplifying circuit such as for example, a FET, dramatically enhancing the sensitivity to motion. Diodic behavior at room temperature is observed by both STM studies and direct transport across large arrays. Thus, in addition to using piezoresistance to detect the branched CNT cantilever motion, a related detection method could integrate the structure into a nanoelectronic transistor circuit, with potential for significant gains in sensitivity.

Nanoscale Scanned Probe Microscopy

In an embodiment, the cantilever probe may be utilized in performing various other types of "scanned probe microscopy" (SPM). In an embodiment, the cantilever is used in atomic force microscopy (AFM).

An embodiment includes an improved method of performing AFM; more specifically, an embodiment provides a method of performing AFM wherein the improvements are in planar spatial resolution, vertical spatial resolution and sensitivity, and data acquisition speed. Such improvements are a result of the nanoscale size of the cantilever probe.

In an embodiment, a y-shaped CNT is utilized to perform AFM. In an embodiment, a first arm of the y-shaped CNT 1 and a second arm of the y-shaped CNT 1 are engaged to a substrate 4. In an embodiment, a third arm of the Y-shaped CNT 1 extends out from the substrate. In an embodiment, the third arm of the Y-shaped CNT 1 does not comprise a magnetic tip. In an embodiment, an electric current is passed between the first arm and the second arm, and the current is measured. Due to intrinsic piezoresistivity, a voltage-to-current ratio (resistance) will change when the cantilever deflects as a result of the free branch experiencing atomic force interaction with atoms on the surface of the object being analyzed.

Due to the nanoscale size of the cantilever, especially the diameter, the spatial resolution of AFM can be improved with this technique. Due to the significantly smaller total mass of the cantilever probe, as compared to that of a conventional silicon cantilever, the minimum response time (or data acquisition time) for an AFM image can be greatly improved (i.e. decreased). This is because the response time varies as the square root of the mass, following Hooke's law.

In addition, use of the AFM cantilever may improve AFM sensitivity, measured as the minimum detectable vertical deflection of the cantilever due to an atomic force interaction with a surface. In conventional AFM devices, imaging sensitivity is limited by such parameters as the mechanics of the cantilever, the absolute temperature, the acoustic environment of the apparatus, the shot noise in the photodiode, and other considerations. Thus, while theoretical limits to spatial (vertical) resolution can be shown to be of the order of about $10^{-5}$ nm, the practical limit is closer to the range of about 0.1 nm to about 0.01 nm. While the AFM cantilever may be limited by many of these same parameters (except those relating to optics, i.e. laser and photodiode), the AFM cantilever does show an improvement over prior art cantilevers. With use of the AFM cantilever of the present invention, a resistance change corresponding to at least about $10^{-3}$ nm may be resolved.

FIG. 5, FIG. 6 and FIG. 7 show an embodiment of the AFM cantilever 1. The only difference between the above-identified figures is the method of engaging the first arm of the cantilever and the second arm of the cantilever to a substrate (discussed above). As shown in FIG. 5, a first electrode 3 and a second electrode 3 are engaged to a substrate 4. In an embodiment, a first arm of the AFM cantilever 1 is engaged to the first electrode 3 and a second arm of the AFM cantilever 1 is engaged to a second electrode. In an embodiment, a third arm projects out from the substrate. In an embodiment, the third arm does not comprise a magnetic material. In an embodiment, a charge is delivered from the first arm engaged to the second arm (arrows 5 in FIG. 5 show the flow of the charge.) In an embodiment, any change in the charge between the first arm and the second arm may be detected by similar means as discussed above.

Various forms of AFM may be performed with the AFM cantilever. In an embodiment, the method comprises performing contact AFM. In an embodiment, the method comprises performing noncontact AFM. In an embodiment, the method comprises performing intermittent contact AFM. In an embodiment, the method comprises performing Lateral Force Microscopy (LFM). In an embodiment, the method comprises performing Atomic Force Acoustic Microscopy (AFAM). In an embodiment, the method comprises performing Spreading Resistance Imaging (SRI). In an embodiment, the method comprises performing AFAM Resonance Spectroscopy. In an embodiment, the method comprises performing Electric Force Microscopy (EFM). In an embodiment, the method comprises performing Scanning Capacitance Microscopy (SCM). In an embodiment, the method comprises performing Kelvin Probe Microscopy (KPM or SKM). In an embodiment, the method comprises performing Dissipation Force Microscopy (DFM). Those skilled in the art will recognize that various other forms of AFM are within the spirit and scope of the present invention.

Cantilever Probes Comprising Non-Carbon Materials

Various embodiments of cantilever probes used in various forms of microscopy, such as MFM, MRFM and AFM are herein disclosed. As discussed above, the cantilevers may comprise nanostructures comprised of carbon. In an embodiment, the cantilevers may comprise non-carbon nanostructures.

In an embodiment, the cantilever is piezoresistive. In an embodiment, the cantilever is intrinsically piezoresistive. In an embodiment, the cantilever is extrinsically piezoresistive. By "intrinsically piezoresistive" it is meant that the cantilever exhibits piezoresistivity. By "extrinsically piezoresistive" it is meant that the cantilever exhibits piezoresistance after being processed in such a way as to induce piezoresistivity or is coated with a piezoresistive material in order to render the cantilever piezoresistive.

As such, in an embodiment, the cantilever comprises non-carbon nanostructures. In an embodiment, the non-carbon nanostructures exhibit piezoresistivity. In an embodiment, a piezoresistive material is engaged to the non-carbon nanostructure.

Figure 8:
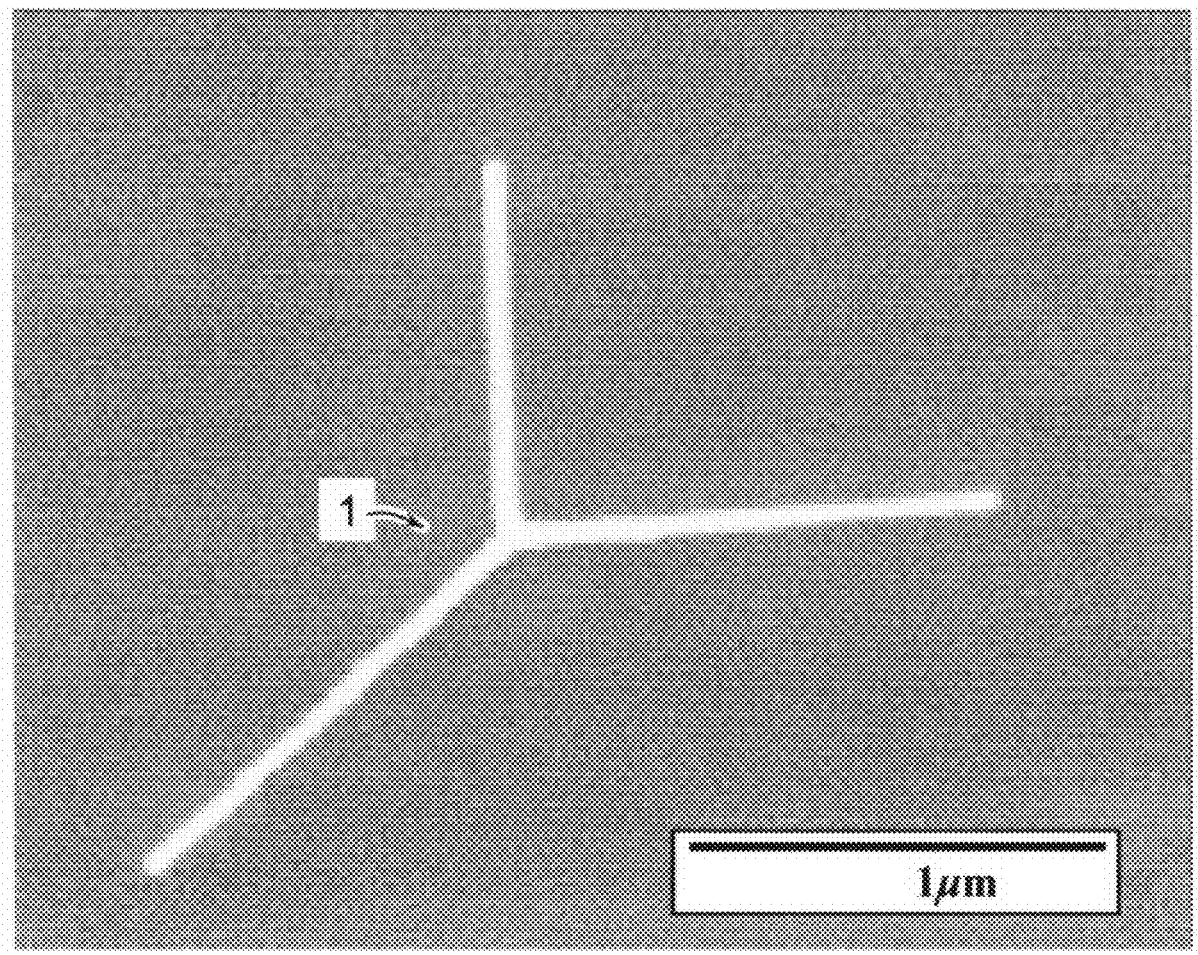
FIG. 8 shows an embodiment of a zinc-oxide (ZnO) nanostructure.

In an embodiment, the non-carbon material is zinc oxide (ZnO). FIG. 8 shows a cantilever probe 1 comprises ZnO. ZnO is known to be piezoelectric and piezoresistive. In an embodiment, the non-carbon material is silicon. In an embodiment, the non-carbon material is boron-nitride (BN). In an embodiment, the non-carbon material is boron-carbide. Those skilled in the art will recognize that non-carbon material may comprise various materials and semiconductors and remain within the spirit and scope of the present invention.

Nanostructures

Various embodiments of cantilever probes are herein disclosed; furthermore, various embodiments disclose the use of such cantilever probes in procedures such as MFM, MRFM and AFM. As discussed above, the cantilevers may comprise nanostructures. In an embodiment, the nanostructure is a nanotube. In an embodiment, the nanostructure is a nanowire. In an embodiment, the nanostructure is a filled tube.

In an embodiment, the nanostrucutres are tubular cylinders and may be designated as nanotubes. In an embodiment, the nanostructures comprise a mixture of crystalline and amorphous carbon. Such structures may be designated nanotubes or nanofibers. In an embodiment, the nanostructure is a nanostalk. In an embodiment, the nanostructures are non-hollow. Those skilled in the art will recognize that various nanostructures are within the spirit and scope of the present invention.

Use of Electron Beam Welding to Provide a Desired Cantilever Morphology

In an embodiment, a method discloses the production of bridged or multiple connected nanostructures such as a Y-shaped, T-shaped, or X-shaped cantilever by a process called electron beam welding. In an embodiment, electron beam welding is performed by arranging a first nanostructure to come into contact with a second nanostructure. Next, an electron beam in an electron microscope is used to engage the first nanostructure with the second nanostructure by focusing the electron beam on a desired junction point for a period of time sufficient to deposit enough of an amount of an amorphous carbon (unavoidably available in the microscope chamber) to make a mechanical connection. This mechanical connection is usually conducting enough to allow electrical current to pass from a first branch to a second branch. As such, any linear nanostructure can be possibly connected to another, forming a desired cantilever.

The embodiments disclosed herein have several advantages. In an embodiment, the invention directly overcomes one of the main disadvantages to observation at the molecular level using cantilevers, that of output signal. In an embodiment, the method uses piezoelectric or piezoresistive detection with CNT cantilevers, thereby eliminating the need for laser interferometry or mirrored-light detection as required by silicon-based cantilevers. CNTs are known in the art to be high strength, mechanically robust, flexible conducting materials. In an embodiment, the use of CNTs as cantilevers in place of silicon-based cantilevers in MRFM, improves the state-of-the-art technology from micrometer-scale resolution by orders of magnitude to nanometer-scale resolution. In an embodiment, nanotubes improve sensitivity and spatial resolution up to about 1,000 times more than possible with silicon-based cantilevers. CNT cantilevers are compatible with conventional technologies for fabricating electrically conducting nanocircuits, such as etched trenches in silicon or surface deposition of thick nanowire contacts. In an embodiment, nanotube cantilevers can be used in inconvenient environments such as biological media. The disclosed devices have the capability of being built in array form, allowing real-time, correlative spectroscopy and imaging. Spatially and temporally correlated detection, in the spirit of functional MRI are possible. The cantilever probe is a unique and enabling technology that has the revolutionary capability to fabricate arrays of ultra-sensitive MRFM devices that can be used for fast imaging. The various embodiments advance the measurement capabilities of magnetic detection by reducing the size of the measurement tools to the nanoscale. Instead of micromachining silicon down to the appropriate size, the embodiments disclose the use of nanostructures.

The embodiments provide new technologies for constructing MFM, MRFM, and AFM instruments that outperform the current generation of instruments by several orders of magnitude in sensitivity and resolution.

The devices of the invention, including mechanical and chemical processes for their preparation, as well as methods for their fabrication will become apparent to one familiar in the art based on the aforementioned embodiments and the following non-limiting examples.

EXAMPLES

Example 1

Preparation of Catalyst Substrate for Synthesis of Linear CNTs

Mesoporous silica containing iron nanoparticles were prepared by a sol-gel process by hydrolysis of tetraethoxysilane (TEOS) in the presence of iron nitrate in aqueous solution following the method described by Li et al. (*Science*, (1996), Vol. 274, 1701-3) with the following modification. The catalyst gel was dried to remove excess water and solvents and calcined for 10 hours at 450° C. and $10^{-2}$ torr to give a silica network with substantially uniform pores containing iron oxide nanoparticles that are distributed within. The catalyst gel is then ground into a fine, micro-particulate powder either mechanically using a ball mill or manually with a pestle and mortar. The ground catalyst particles provide particle sizes that range between 0.1 and 100 μM under the grinding conditions.

Example 2

Preparation of Catalyst Substrate for Synthesis of Branched CNTs

Catalyst substrates were prepared following the method described by Li et al. (*Applied Physics Letters* (2001) Vol. 79(12), 1879-1881). Magnesium oxide (MgO) supported cobalt (Co) catalysts were prepared by dissolving 0.246 g of cobalt nitrate hexahydrate ($Co(NO_3)_2.6H_2O$, 98%) in 40 ml ethyl alcohol, following immersing 2 g of particulate MgO powder (−325 mesh) were added to the solution with sonication for 50 minutes. The solid residue was filtered, dried and calcined at 130° C. for 14 hours.

Example 3

General Synthetic Procedure for Branched CNTs

The MgO supported cobalt catalyst of Example 2 were first reduced at 1000° C. for 1 hour in a pyrolytic chamber under a flow of a mixture hydrogen (40 sccm) and nitrogen (100 sccm) at a pressure of 200 Torr. The nitrogen gas was subsequently replaced with methane (10 sccm) to initiate CNT growth. The optimum reaction time for producing branched CNTs was 1 hour.

Example 4

Characterization of CNT Morphology and Purity by Scanning Electron Microscopy (SEM), and Tubule Structure and Diameter by Transmission Electron Microscopy (TEM)

Scanning electron microscopy (SEM) for characterization and verification of CNT morphology and purity was performed on a JEOL JSM-6340F spectrophotometer that was equipped with an energy dispersive x-ray (EDS) accessory. Standard sample preparation and analytical methods were used for the SEM characterization using a JEOL JSM-6340F microscope. SEM micrographs of appropriate magnification were obtained to verify tubule morphology, distribution and purity.

Transmission electron microscopy (TEM) to characterize individual tubule structure and diameter of the CNTs was performed on a JEOL 2010 TEM microscope. Sample specimens for TEM analysis were prepared by mild grinding the CNTs in anhydrous ethanol. A few drops of the ground suspension were placed on a micro-grid covered with a perforated carbon thin film. Analysis was carried out on a JEOL 2010 microscope. TEM micrographs of appropriate magnification were obtained for determination of tubule structure and diameter.

Example 5

Controllable Creation of Arrays of Addressable Multi-Walled Carbon Nanotubes

CNTs are grown by the plasma-enhanced hot filament chemical vapor deposition method, including on an e-beam patterned substrate. Metallic nickel, deposited via e-beam lithography over a non-catalytic metal provides the electrical leads, is used as the catalyst for CNT growth.

Example 6

Microdimensional Electrically Addressable Probe Fabrication

Catalyst Deposition on Substrate

The preliminary step in probe fabrication involves a micro- and nanolithographic preparation of CNT catalyst sites and metallic addressing wires on single crystal silicon wafers. Conventional e-beam evaporation of nickel (Ni) or cobalt (Co) is used after an e-beam lithography step is performed on the substrate to define the catalyst sites in an e-beam resist.

This is followed by a lift-off step (of the unwanted catalyst material), leaving only the Ni or Co nanodots on top of the gold leads. Alternatively, a self-assembly of catalyst nanoparticles from a catalyst-containing solution is used, which precludes the need for the lift-off step. In either case, at the end of this phase, electrically addressable pairs of CNTs with well-defined heights and lateral separations are prepared. Separations between nanotubes down to 10 nm, can be obtained reproducibly by these methods.

Fabrication of Electrically-Addressable Carbon Nanotube Arrays

An array of aligned CNTs are grown on the substrate containing catalytic sites via hot filament, plasma-enhanced chemical vapor deposition (PECVD). A series of thin gold wires lithographically on the silicon is defined, with the inner ends of pairs of individual wires in very close proximity (about 100 nm). At these proximal ends, a CNT growth catalyst (for example, Ni or Co) nanodot site is defined using e-beam lithography, and the catalyst material deposited. This wafer is then placed in the CVD chamber, with subsequent CNT growth occurring only at the catalyst nucleation sites. At this point the gold wires may be passivated using electropolymerization. If deemed necessary, additional steps can be introduced to obtain strictly uniform height of the CNTs in the arrays. Depending on growth conditions used, CNTs height in an array in a given growth run can be varied in height by 10%-50%. Height uniformity is accomplished by performing additional mechanical polish steps.

All patents, patent applications, and published references cited herein are hereby incorporated by reference in their entirety. While this invention has been particularly shown and described with references to preferred embodiments thereof, it will be understood by those skilled in the art that various changes in form and details may be made therein without departing from the scope of the invention encompassed by the appended claims.

What is claimed is:

1. An electrical probe comprising at least one nanotube attached to a substrate material and extending outwardly from an outer surface of the substrate material, wherein the at least one nanotube is coated with a plurality of microparticulate ferromagnetic materials that are capable of generating a magnetic field and sensing a magnetic response.

2. The probe of claim 1, wherein at least one nanotube exhibits piezoresistance.

3. The probe of claim 1, wherein at least one nanotube is a carbon nanotube.

4. The probe of claim 3, wherein the carbon nanotube has a multi-walled morphology.

5. The probe of claim 1, wherein at least one nanotube has at least one tubule with a Y-shaped or V-shaped morphology.

6. The probe of claim 1, wherein the plurality of microparticulate ferromagnetic materials comprises at least one transition metal.

7. The probe of claim 6, wherein the transition metal is selected from the group consisting of iron, cobalt, nickel and combinations and alloys thereof.

8. The probe of claim 1, wherein at least one nanotube has a low electrical resistance and a high mechanical strength.

9. The probe of claim 1, wherein the probe is part of a microscopic imaging device.

10. The probe of claim 9, wherein the microscopic imaging device is a magnetic force microscopy device or a magnetic resonance force microscopy device.

11. A method of fabricating a probe for manipulating a microscopic environment comprising:
preparing a substrate material comprising a plurality of metallic electrodes on a surface of the substrate material; and
attaching a first branch and a second branch of a Y-shaped nanotube on a pair of the metallic electrodes on the surface of the substrate material wherein a third branch of the Y-shaped nanotube is cantilevered outwardly from the surface of the substrate material.

12. The method of claim 11, wherein the Y-shaped nanotube exhibits piezoresistance.

13. The method of claim 11, wherein the Y-shaped nanotube is a carbon nanotube.

14. The method of claim 11, wherein the substrate material is a semiconductor material.

15. The method of claim 11, wherein the substrate material is silicon.

16. The method of claim 11, wherein the substrate material is selected from the group consisting of a silicon wafer, silicon plate and silicon chip.

17. The method of claim 11, further comprising engaging the first branch and the second branch of Y-shaped nanotube to a pair of electrodes on the substrate material by electrodeposition, electroless deposition, or electron beam welding.

18. The method of claim 11, further comprising attaching a plurality of ferromagnetic materials on a terminus of the first branch or the second branch of the Y-shaped nanotube.

19. The method of claim 11, further comprising coating a terminus of the first branch or the second branch of the Y-shaped nanotube with a plurality of ferromagnetic materials.

20. The method of claim 11, further comprising adhesively attaching a plurality of ferromagnetic materials to a terminus of the first branch and a terminus of the second branch of the Y-shaped nanotube.

* * * * *